(12) United States Patent
Jang

(10) Patent No.: US 7,046,074 B2
(45) Date of Patent: May 16, 2006

(54) INTERNAL VOLTAGE GENERATOR

(75) Inventor: Kyeong Sik Jang, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 4 days.

(21) Appl. No.: 10/850,843

(22) Filed: May 21, 2004

(65) Prior Publication Data
US 2005/0200401 A1    Sep. 15, 2005

(30) Foreign Application Priority Data
Mar. 11, 2004    (KR)    ............... 10-2004-0016574

(51) Int. Cl.
*G05F 1/10*    (2006.01)
(52) U.S. Cl. .................................. 327/534
(58) Field of Classification Search ............ 327/530, 327/534
See application file for complete search history.

(56) References Cited

U.S. PATENT DOCUMENTS

| | | | | |
|---|---|---|---|---|
| 5,448,198 A | * | 9/1995 | Toyoshima et al. | ...... 327/530 |
| 5,461,338 A | * | 10/1995 | Hirayama et al. | ...... 327/534 |
| 5,552,723 A | * | 9/1996 | Shigehara et al. | ...... 326/86 |
| 5,610,533 A | * | 3/1997 | Arimoto et al. | ...... 326/33 |
| 5,748,016 A | * | 5/1998 | Kurosawa | ...... 327/108 |
| 5,786,724 A | * | 7/1998 | Teggatz | ...... 327/534 |
| 6,191,615 B1 | * | 2/2001 | Koga | ...... 326/81 |
| 6,232,793 B1 | * | 5/2001 | Arimoto et al. | ...... 326/34 |
| 6,255,851 B1 | * | 7/2001 | Strauss | ...... 326/81 |
| 6,304,110 B1 | * | 10/2001 | Hirano | ...... 327/108 |
| 6,333,571 B1 | * | 12/2001 | Teraoka et al. | ...... 307/125 |
| 6,469,568 B1 | * | 10/2002 | Toyoyama et al. | ...... 327/534 |
| 6,741,098 B1 | * | 5/2004 | Takahashi et al. | ...... 326/81 |
| 6,765,430 B1 | * | 7/2004 | Ando | ...... 327/534 |
| 2005/0127921 A1 | * | 6/2005 | Sugiura | ...... 324/522 |

* cited by examiner

*Primary Examiner*—Jeffrey Zweizig
(74) *Attorney, Agent, or Firm*—Ladas & Parry LLP

(57) ABSTRACT

The present invention discloses an internal voltage generator which can restrict abnormal variations of an internal voltage resulting from a leakage current generated in a driving transistor. The internal voltage generator includes a comparator for receiving a reference voltage through its first input terminal, receiving the internal voltage through its second input terminal, and comparing the reference voltage with the internal voltage, a driving transistor for receiving the output signal from the comparator through its gate terminal, a first terminal of which being coupled to a driving voltage, a second terminal of which being an output terminal for outputting the internal voltage, a back bias circuit for supplying a predetermined potential of back bias voltage to a well region of the driving transistor, and a controller for receiving the output signal from the comparator, and controlling the operation of the back bias circuit. The second terminal of the driving transistor is feedback-coupled to the second input terminal of the comparator. When the driving transistor is turned off according to the output signal from the comparator, the controller for receiving the output signal from the comparator supplies the predetermined potential of back bias voltage to the well region of the driving transistor by driving the back bias circuit.

5 Claims, 2 Drawing Sheets

INTERNAL VOLTAGE GENERATOR

BACKGROUND OF THE INVENTION

1. Field of the Invention

The present invention relates to an internal voltage generator, and more particularly to, an internal voltage generator which can restrict abnormal variations of an internal voltage resulting from a leakage current generated in a driving transistor.

2. Description of the Related Art

FIG. 1 is a circuit diagram illustrating a conventional internal voltage generator.

Referring to FIG. 1, the conventional internal voltage generator includes a comparator 100 and a PMOS driving transistor PM1. The comparator 100 compares a reference voltage Vref inputted to its negative terminal with an internal voltage Vint inputted to its positive terminal, and outputs the comparison result. The PMOS driving transistor PM1 is turned on/off according to the output signal from the comparator 100. The PMOS driving transistor PM1 has its source terminal connected to a driving voltage VDD. When the PMOS driving transistor PM1 is turned on, the PMOS driving transistor PM1 supplies the internal voltage Vint to the inside of a semiconductor device through its drain terminal. Still referring to FIG. 1, the drain terminal of the PMOS driving transistor PM1 is feedback-coupled to the positive terminal of the comparator 100.

The operation of the internal voltage generator of FIG. 1 will now be explained.

The comparator 100 compares the reference voltage Vref with the internal voltage Vint. When the internal voltage Vint is lower than the reference voltage Vref, the comparator 100 outputs a low level signal to turn on the PMOS driving transistor PM1. Accordingly, the driving voltage VDD of the source terminal is transmitted to the drain terminal, to increase the internal voltage Vint. When the increased internal voltage Vint is over the reference voltage Vref, the output from the comparator 100 has a high level, to turn off the PMOS driving transistor PM1. Therefore, increase of the internal voltage Vint is restricted. When a predetermined time elapses, the internal voltage Vint becomes lower than the reference voltage Vref, and the aforementioned procedure is repeated. As a result, power is continuously consumed in the internal voltage generator.

However, the conventional internal voltage generator has the following disadvantages.

1. Power consumption increases in the internal voltage generator due to a high speed tendency of the semiconductor device.

2. In spite of high integration of the semiconductor device, driving capability must be improved by using a large-sized driving transistor to generate a stable internal voltage.

3. As the driving voltage of the semiconductor device is lowered, a threshold voltage of the driving transistor is also lowered. When the threshold voltage is lowered, although the driving transistor must maintain a turn-off state, a leakage current is generated, to unnecessarily increase the internal voltage. The leakage current is $I_o * \exp(Vgs - Vth)/nkT$ in the turn-off state. That is, when the size of the driving transistor increases and the threshold voltage decreases, the leakage current increases.

SUMMARY OF THE INVENTION

Accordingly, the present invention has been made in an effort to solve the problems occurring in the related art, and an object of the present invention is to provide an internal voltage generator which can reduce power consumption.

Another object of the present invention is to provide an internal voltage generator which can restrict abnormal variations of an internal voltage resulting from a leakage current generated in a driving transistor in a turn-off state.

Still another object of the present invention is to provide an internal voltage generator which can reduce a leakage current by controlling a back bias voltage of a driving transistor.

In order to achieve the above objects, according to one aspect of the present invention, there is provided an internal voltage generator for generating an internal voltage for a semiconductor device, the internal voltage generator including: a comparator for receiving a reference voltage through its first input terminal, receiving the internal voltage through its second input terminal, and comparing the reference voltage with the internal voltage; a driving transistor for receiving the output signal from the comparator through its gate terminal, a first terminal of which being coupled to a driving voltage, a second terminal of which being an output terminal for outputting the internal voltage; a back bias circuit for supplying a predetermined potential of back bias voltage to a well region of the driving transistor; and a controller for receiving the output signal from the comparator, and controlling the operation of the back bias circuit.

According to another aspect of the present invention, the second terminal of the driving transistor is feedback-coupled to the second input terminal of the comparator. When the driving transistor is turned off according to the output signal from the comparator, the controller for receiving the output signal from the comparator supplies the predetermined potential of back bias voltage to the well region of the driving transistor by driving the back bias circuit.

According to still another aspect of the present invention, when the semiconductor device is in a standby mode, the controller senses the standby mode, and supplies the predetermined potential of back bias voltage to the well region of the driving transistor by driving the back bias circuit.

According to still another aspect of the present invention, the back bias circuit includes a MOS transistor. When the MOS transistor is turned on by the controller, the predetermined potential of back bias voltage is supplied to the well region of the driving transistor. Here, the back bias voltage is higher than the driving voltage supplied to the driving transistor.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Figure 1:
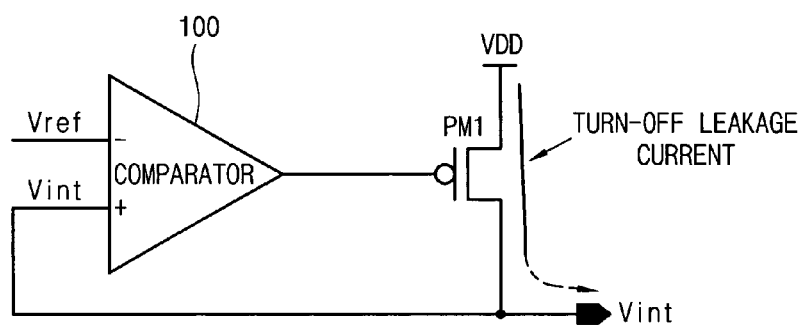
FIG. 1 is a circuit diagram illustrating a conventional internal voltage generator.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 2:
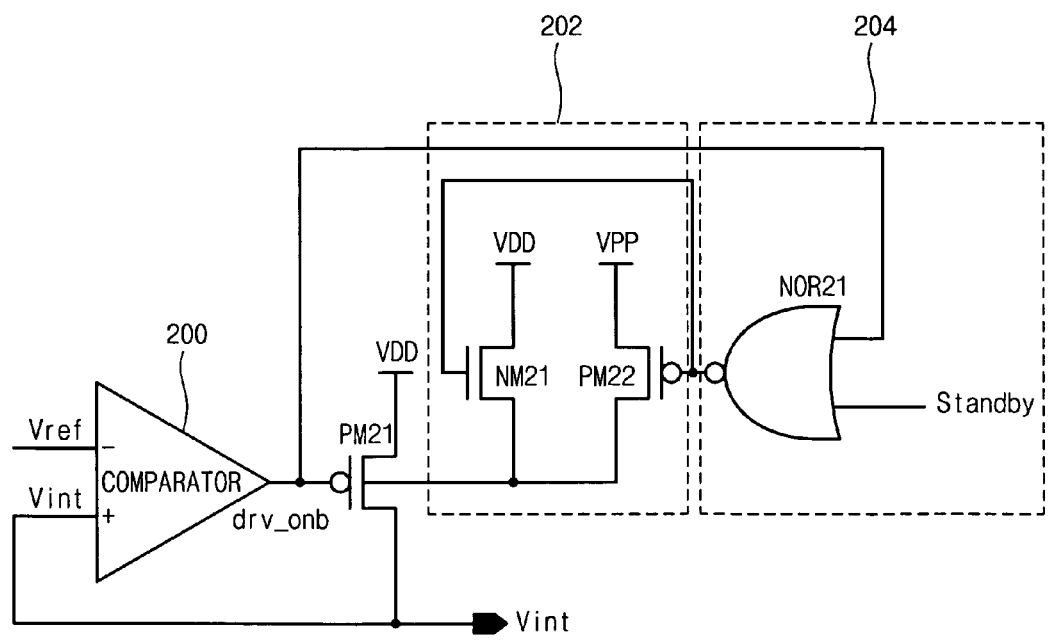
FIG. 2 is a circuit diagram illustrating an internal voltage generator in accordance with a first embodiment of the present invention.

FIG. 2 is a circuit diagram illustrating an internal voltage generator in accordance with a first embodiment of the present invention.

As illustrated in FIG. 2, the internal voltage generator for generating an internal voltage for a semiconductor device includes a comparator 200, a driving transistor PM21, a back bias circuit 202 and a controller 204.

The comparator 200 receives a reference voltage Vref through its first input terminal, namely a negative terminal, receives the internal voltage Vint through its second input terminal, namely a positive terminal, and compares the reference voltage Vref with the internal voltage Vint. The comparator 200 can be embodied as various circuits by those skilled in the art.

The driving transistor PM21 receives the output signal from the comparator 200 through its gate terminal. A first terminal of the driving transistor PM21, namely a source terminal is coupled to a driving voltage VDD, and a second terminal of the driving transistor PM21, namely a drain terminal is an output terminal for outputting the internal voltage Vint. Still referring to FIG. 2, the output terminal of the driving transistor PM21 is coupled to the positive terminal of the comparator 200.

The back bias circuit 202 supplies a predetermined potential of back bias voltage to a well region of the driving transistor PM21, and the controller 204 receives the output signal from the comparator 200 and controls the operation of the back bias circuit 202.

The back bias circuit 202 includes an NMOS transistor NM21 coupled between the driving voltage VDD and the well region of the driving transistor PM21, and a PMOS transistor PM22 coupled between a high voltage VPP and the well region of the driving transistor PM21. Here, the high voltage VPP has a higher potential level than the driving voltage VDD.

The controller 204 includes a NOR gate NOR21. The NOR gate NOR21 receives the output signal drv_onb from the comparator 200 and a standby signal standby. The standby signal is enabled when the semiconductor device including the internal voltage generator is in a standby mode. A logical level of the standby signal is low in the normal mode and high in the standby mode.

The operation of the internal voltage generator of FIG. 2 will now be described.

While the semiconductor device is normally operated, the internal voltage generator is also normally operated. In the normal operation mode, the standby signal has a low level.

In the normal operation, when the internal voltage Vint is lower than the reference voltage Vref, the output signal from the comparator 200 has a low level. Therefore, the driving transistor PM21 is turned on, to increase the internal voltage Vint. In the case that the output from the comparator 200 has a low level, the output from the NOR gate NOR21 has a high level (because the standby signal also has a low level). Accordingly, the NMOS transistor NM21 is turned on, and the predetermined potential of back bias voltage is supplied to the well region of the driving transistor PM21. Here, a leakage current problem does not occur in the driving transistor PM21, and thus the back bias voltage of the driving transistor PM21 is actually less important.

When the internal voltage Vint rises over the reference voltage Vref, the output signal from the comparator 200 has a high level. Therefore, the driving transistor PM21 is turned off, to prevent the internal voltage Vint from being increased. As explained above with reference to FIG. 1, the internal voltage Vint is increased by the leakage current.

However, in accordance with the present invention, as shown in FIG. 2, flow of the leakage current is intercepted by increasing the well bias voltage of the driving transistor PM21 by using the controller 204 for receiving the output signal from the comparator 200 and the back bias circuit 202 controlled by the controller 204.

That is, when the output from the comparator 200 has a high level, the output from the NOR gate NOR21 has a low level, to turn on the PMOS transistor PM22. Accordingly, the high back bias voltage is supplied to the well region of the driving transistor PM21. As a result, generation of the turn-off leakage current is restricted in the driving transistor PM21.

Figure 3:
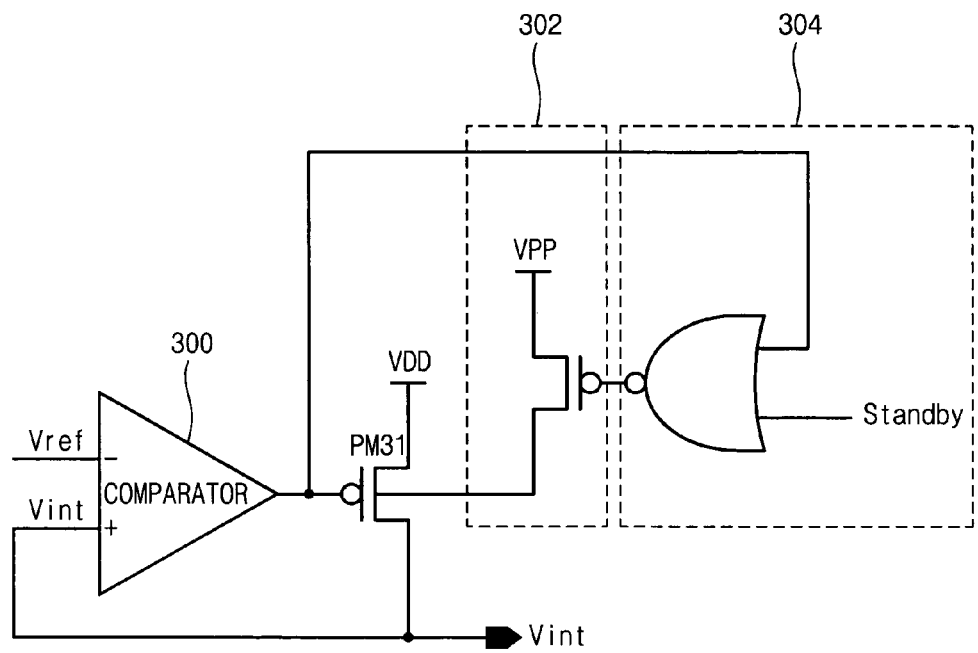
FIG. 3 is a circuit diagram illustrating an internal voltage generator in accordance with a second embodiment of the present invention.

FIG. 3 is a circuit diagram illustrating an internal voltage generator in accordance with a second embodiment of the present invention.

As depicted in FIG. 3, the internal voltage generator for generating an internal voltage for a semiconductor device includes a comparator 300, a driving transistor PM31, a back bias circuit 302 and a controller 304.

The internal voltage generator of FIG. 3 is identical to the internal voltage generator of FIG. 2 except that the back bias circuit 302 merely includes PMOS transistors. Thus, the circuit operation of FIG. 3 is basically identical to that of FIG. 2.

Figure 4:
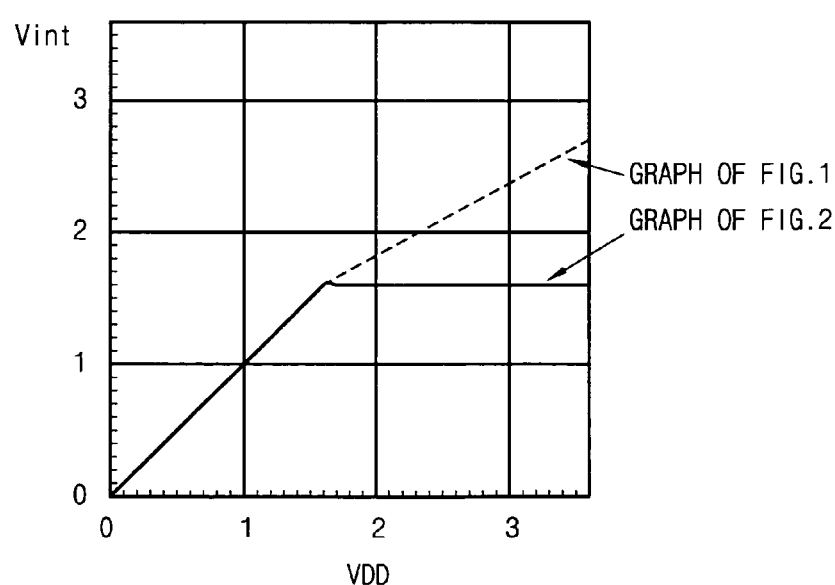
FIG. 4 is a graph showing variations of an internal voltage by a leakage current.

FIG. 4 is a graph showing variations of the internal voltage by the leakage current.

In FIG. 4, a transverse axis shows the driving voltage VDD, and an ordinate axis shows the internal voltage Vint. A dotted line shows the internal voltage in the conventional circuit of FIG. 1, and a solid line shows the internal voltage in the circuit of the present invention.

As shown in FIG. 4, in the conventional internal voltage generator, the reference voltage Vref is continuously increased by the leakage current due to increase of the driving voltage VDD. However, in the internal voltage generator of the present invention, even when the driving voltage exceeds a predetermined level, a stabilized voltage is outputted.

As discussed earlier, as the semiconductor device obtains a high speed and the driving voltage is lowered, the size of the driving transistor of the internal voltage generator has increased to generate the stabilized back bias voltage, and the circuit using the driving transistor having the low threshold voltage has been suggested to improve the speed. However, the leakage current is also increased to cause abnormal variations of the internal voltage. In accordance with the present invention, the circuit for controlling the back bias voltage of the driving transistor is additionally provided, to minimize the turn-off leakage current of the driving transistor.

In addition, the internal voltage generator can be applied to all semiconductor devices.

As apparent from the above description, the present invention additionally provides the circuit for intercepting or restricting the leakage current in the driving transistor of the internal voltage generator, thereby outputting the stabilized internal voltage. As a result, the operation of the semiconductor device using the same can be stabilized.

Furthermore, the voltage variations are intercepted by restricting the leakage current, the threshold voltage of the driving transistor is more lowered, and thus the size of the driving transistor is considerably reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An internal voltage generator for generating an internal voltage for a semiconductor device, the internal voltage generator comprising:
   a comparator receiving a reference voltage through its first input terminal, receiving the internal voltage through its second input terminal, comparing the reference voltage with the internal voltage, and producing an output signal at an output terminal;
   a driving transistor receiving the output signal from the comparator through its gate terminal, a first terminal of which being coupled to a driving voltage, a second terminal of which being an output terminal for outputting the internal voltage, the output terminal of the driving transistor also being coupled to the second input terminal of the comparator, the driving transistor further having a well region;
   a back bias circuit supplying either the driving voltage or a first back bias voltage to the well region of the driving transistor; and
   a controller receiving the output signal from the comparator at a first input and receiving a standby signal at a second input, and controlling the operation of the back bias circuit to apply the driving voltage to the well region of the driving transistor when the internal voltage is less than the reference voltage and to apply the first back bias voltage to the well region of the driving transistor when the internal voltage exceeds the reference voltage.

2. The internal voltage generator of claim 1, wherein, when the semiconductor device is in a standby mode, the controller supplies the first back bias voltage to the well region of the driving transistor by driving the back bias circuit.

3. The internal voltage generator of claim 1, wherein
   an NMOS transistor is coupled between the driving voltage and the well region of the driving transistor; and
   a PMOS transistor is coupled between the first back bias voltage that is greater than the driving voltage and the well region of the driving transistor.

4. The internal voltage generator of claim 1, wherein the driving transistor is a first PMOS transistor.

5. The internal voltage generator of claim 1, wherein the controller comprises a NOR gate having at least two inputs and an output, the NOR gate receiving the output signal from the comparator at a first input and receiving the standby signal at a second input, the output of the NOR gate being output to the back bias circuit.

* * * * *